US012733185B2

(12) United States Patent
Park et al.

(10) Patent No.: US 12,733,185 B2

(45) Date of Patent: Sep. 8, 2026

(54) INTEGRATED CIRCUIT DEVICE

(71) Applicant: SAMSUNG ELECTRONICS CO., LTD., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 479 days.

(21) Appl. No.: 18/238,028

(22) Filed: Aug. 25, 2023

(65) Prior Publication Data

US 2024/0072106 A1 Feb. 29, 2024

(30) Foreign Application Priority Data

Aug. 26, 2022 (KR) ........................ 10-2022-0107901

(51) Int. Cl.

*H10B 53/00* (2023.01)
*H10B 53/10* (2023.01)
*H10B 53/30* (2023.01)
*H10D 1/68* (2025.01)

(52) U.S. Cl.

CPC ............ *H10D 1/684* (2025.01); *H10B 53/10* (2023.02); *H10B 53/30* (2023.02)

(58) Field of Classification Search

CPC .......... H10D 1/684; H10D 1/68; H10B 53/10; H10B 53/30; H10B 12/033; H10B 12/31; H10B 12/315

See application file for complete search history.

(56) References Cited

U.S. PATENT DOCUMENTS 9,178,006 B2 11/2015 Rui et al.
11,239,239 B2 2/2022 Jung et al.
11,322,578 B2 5/2022 Lim et al.
2014/0231958 A1 8/2014 Lim et al.
2018/0240804 A1 8/2018 Yoo
2021/0359082 A1* 11/2021 Kang ........................ H10D 1/68
2022/0093603 A1 3/2022 Cho et al.
2022/0271046 A1* 8/2022 Huang .................. H10B 51/30
2022/0301785 A1* 9/2022 Chen .................... H01G 4/1236

(Continued)

FOREIGN PATENT DOCUMENTS

EP 3971976 A1 3/2022
JP 3182909 B2 7/2001

(Continued)

*Primary Examiner* — Samuel Park

(74) *Attorney, Agent, or Firm* — Muir Patent Law, PLLC

(57) ABSTRACT

An integrated circuit device may include a transistor on a substrate, and a capacitor structure electrically connected to the transistor. The capacitor structure may include a first electrode, a dielectric layer structure on the first electrode, and a second electrode on the dielectric layer structure. The dielectric layer structure may include a plurality of first dielectric layers and a plurality of second dielectric layers which are alternately stacked. Each of the plurality of first dielectric layers may include an anti-ferroelectric material, and each of the plurality of second dielectric layers includes $Hf_{1-x}Zr_xO_2$ in which $0<x<0.5$, as a ferroelectric material. An x value may gradually change in a stack direction inside each of plurality of second dielectric layers.

20 Claims, 13 Drawing Sheets

(56) References Cited

U.S. PATENT DOCUMENTS

2022/0416055 A1* 12/2022 Maeng .................. H10D 1/684
2023/0163160 A1 5/2023 Park et al.

FOREIGN PATENT DOCUMENTS

KR 10-2020-0115693 A 10/2020
KR 10-2021-0142356 A 11/2021
KR 10-2023-0074349 A 5/2023

* cited by examiner

INTEGRATED CIRCUIT DEVICE

CROSS-REFERENCE TO RELATED APPLICATION

Korean Patent Application No. 10-2022-0107901, filed on Aug. 26, 2022, in the Korean Intellectual Property Office, is incorporated by reference herein in its entirety.

BACKGROUND

1. Field

Embodiments relate to an integrated circuit device, and more particularly, to an integrated circuit device including a capacitor.

2. Description of the Related Art

In an integrated circuit device, such as dynamic random-access memory (DRAM), the area of the unit cell decreases as a degree of integration increases, while necessary capacitance is maintained or increases. There is a need for a structure capable of maintaining desired electrical characteristics by overcoming a spatial limitation and a limitation of a design rule of a capacitor and improving capacitance.

SUMMARY

Embodiments are directed to an integrated circuit device. The integrated circuit device may include a transistor on a substrate, and a capacitor structure electrically connected to the transistor. The capacitor structure may include a first electrode, a dielectric layer structure on the first electrode, and a second electrode on the dielectric layer structure. The dielectric layer structure may include a plurality of first dielectric layers and a plurality of second dielectric layers which are alternately stacked. Each of the plurality of first dielectric layers may include an anti-ferroelectric material, and each of plurality of second dielectric layers includes $Hf_{1-x}Zr_xO_2$ (where $0<x<0.5$) as a ferroelectric material. An x value may gradually change in a stack direction inside each of plurality of second dielectric layers.

Embodiments are also directed to an integrated circuit device. The integrated circuit device may include a transistor on a substrate, and a capacitor structure electrically connected to the transistor. The capacitor structure may include a first electrode, a dielectric layer structure on the first electrode, and a second electrode on the dielectric layer structure. The dielectric layer structure may include a plurality of first dielectric layers and a plurality of second dielectric layers which are alternately stacked. Each of the plurality of first dielectric layers may include an anti-ferroelectric material containing a metal A and oxygen. Each of plurality of second dielectric layers may include a ferroelectric material containing a metal A, a metal B, and oxygen, and includes $A_xB_{1-x}O_2$ (where $0<x<0.5$). An x value may gradually change in a stack direction inside each of plurality of second dielectric layers.

Embodiments are also directed to an integrated circuit device. The integrated circuit device may include a word line in a word line trench extending in a first direction inside a substrate, a contact structure on one side of the word line on the substrate, and a capacitor structure on the contact structure and electrically connected to the contact structure. The capacitor structure may include a first electrode on the contact structure, a dielectric layer structure covering the first electrode, and a second electrode on the dielectric layer structure. The dielectric layer structure may include a plurality of anti-ferroelectric material layers and a plurality of ferroelectric material layers which are alternately stacked. Each of the plurality of ferroelectric material layers may include $Hf_{1-x}Zr_xO_2$ (where $0<x<0.5$), and an x value increases by a unit of 0.1 in a stack direction inside each of the plurality of ferroelectric material layers.

BRIEF DESCRIPTION OF THE DRAWINGS

Features will become apparent to those of skill in the art by describing in detail example embodiments with reference to the attached drawings in which.

DETAILED DESCRIPTION OF THE EMBODIMENTS

Recently, with the rapid development of miniaturized semiconductor process technology, the area of a unit cell is decreasing as high integration of integrated circuit devices is accelerated. Accordingly, the area occupied by the capacitor in the unit cell is also decreasing. Example embodiments provide an integrated circuit device including a capacitor structure capable of securing necessary capacitance. The problem to be solved by the example embodiments is not limited to the problems mentioned herein, and other problems not mentioned will be clearly understood by those skilled in the art from the following description.

Figure 1:
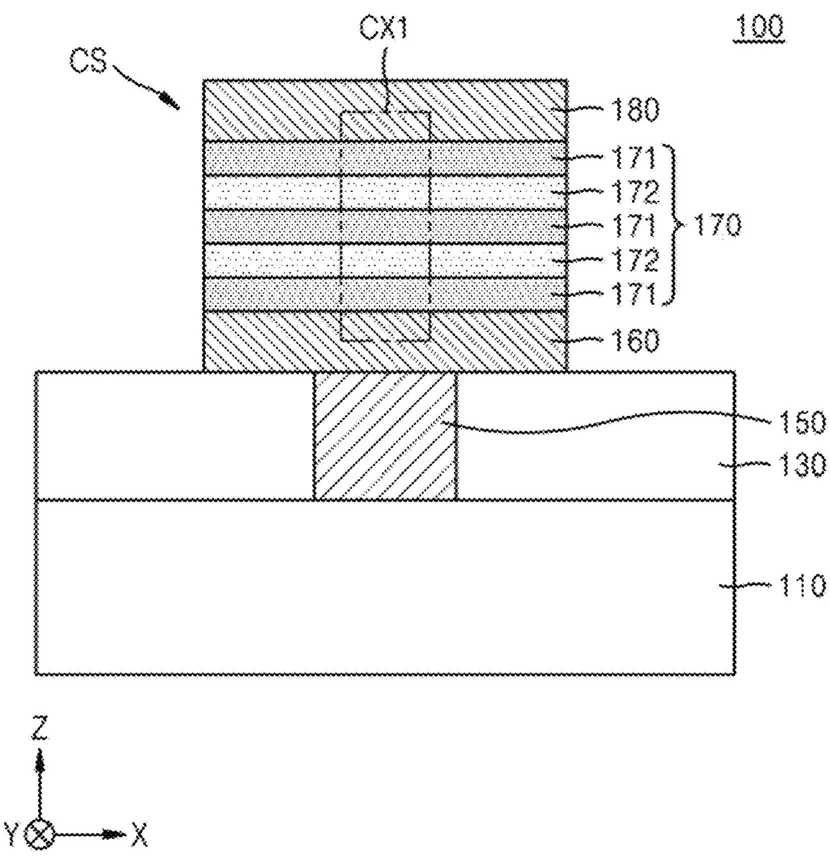
FIG. 1 is a cross-sectional view illustrating an integrated circuit device according to an example embodiment.
Figure 2:
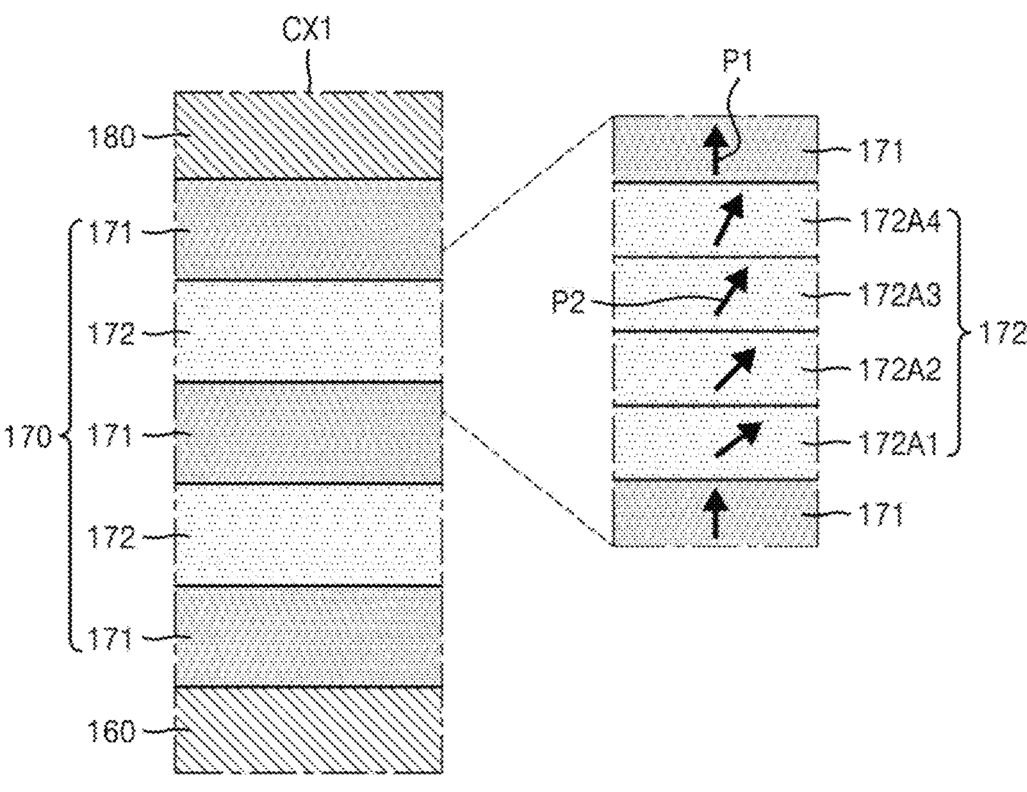
FIG. 2 is an enlarged view of a portion CX1 of FIG. 1.
Figure 3:
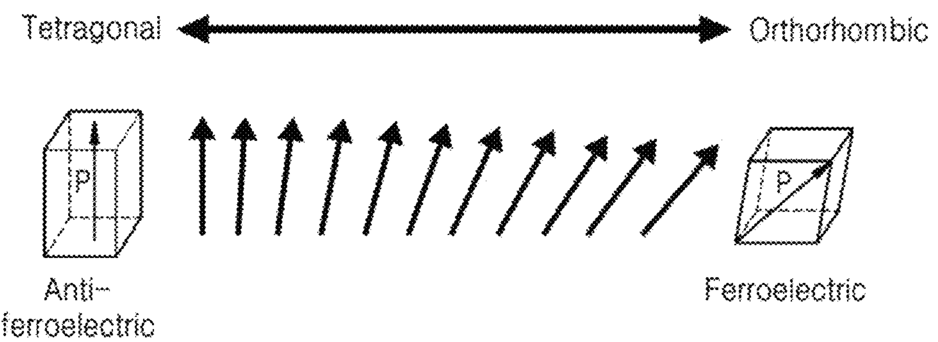
FIG. 3 is a schematic diagram illustrating a polarization direction according to a crystal structure in the integrated circuit device of FIG. 1.
Figure 3:
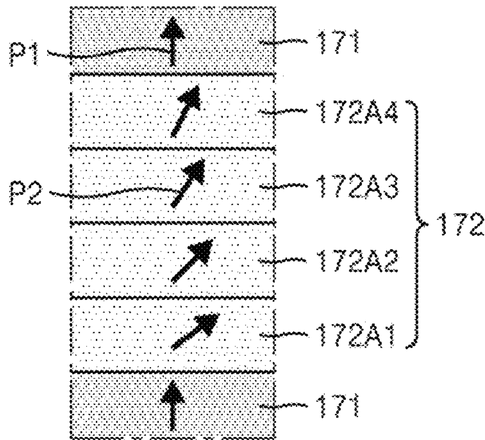

FIG. 1 is a cross-sectional view illustrating an integrated circuit device according to an example embodiment, FIG. 2 is an enlarged view of a portion CX1 of FIG. 1, and FIG. 3 is a schematic diagram illustrating a polarization direction according to a crystal structure in the integrated circuit device of FIG. 1.

Referring to FIGS. 1 to 3, an integrated circuit device 100 of the example embodiments may include a lower insulating layer 130 on a substrate 110, a contact 150 on the substrate 110 and covered by the lower insulating layer 130, and a capacitor structure CS on the contact 150.

The substrate 110 may include a semiconductor material, such as silicon (Si), germanium (Ge), silicon germanium (SiGe), silicon carbide (SiC), gallium arsenide (GaAs), indium arsenide (InAs), or indium phosphide (InP). In some embodiments, the substrate 110 may include a conductive region, e.g., a well doped with an impurity or a structure doped with an impurity.

In an implementation, a switching device, such as a transistor or a diode, providing a signal to the capacitor structure CS may be on the substrate 110. The lower insulating layer 130 may be on the substrate 110 to cover the switching device, and the contact 150 may be electrically connected to the switching device.

The capacitor structure CS may include a first electrode 160, a dielectric layer structure 170, and a second electrode 180 sequentially on the contact 150. In some embodiments, the dielectric layer structure 170 may be between the first electrode 160 and the second electrode 180, and the first electrode 160 may be in contact with the contact 150. In some embodiments, the dielectric layer structure 170 may be between the first electrode 160 and the second electrode 180, and the second electrode 180 may be in contact with the contact 150.

Each of the first electrode 160 and the second electrode 180 may include, e.g., doped polysilicon, a metal, such as ruthenium (Ru), titanium (Ti), tantalum (Ta), and tungsten (W), or a metal nitride, such as titanium nitride (TiN), tantalum nitride (TaN), tungsten nitride (WN), chromium nitride (CrN), vanadium nitride (VN), molybdenum nitride (MoN), niobium nitride (NbN), titanium silicon nitride (TiSiN), or titanium metal nitrides such as aluminum nitride (TiAlN) and tantalum aluminum nitride (TaAlN). In some embodiments, each of the first electrode 160 and the second electrode 180 may include a single-layer or multi-layer structure of the above materials. As used herein, the term "or" is not an exclusive term, e.g., "A or B" would include A, B, or A and B.

The dielectric layer structure 170 may include a structure in which a plurality of first dielectric layers 171 and a plurality of second dielectric layers 172 are alternately stacked. The first dielectric layers 171 may be lowermost and uppermost in a stacked structure constituting the dielectric layer structure 170. In an implementation, the first dielectric layer 171 that is lowermost may face or contact the first electrode 160, and the first dielectric layer 171 that is uppermost may face or contact the second electrode 180.

In some embodiments, each of the plurality of first dielectric layers 171 may include an anti-ferroelectric material. In an implementation, the first dielectric layer 171 may include, e.g., $ZrO_2$, $PbZrO_3$, $PbTiO_3$, or $AgNbO_3$.

In some embodiments, the anti-ferroelectric material may further include a dopant, and the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) or tin (Sn).

In the integrated circuit device 100 of the example embodiments, the first dielectric layer 171 may be an anti-ferroelectric material containing a metal A and oxygen. In an implementation, the metal A may be zirconium (Zr), and the first dielectric layer 171 may be zirconium oxide ($ZrO_2$). In an implementation, the first dielectric layer 171 may be configured as a single metal oxide layer.

The first dielectric layer 171 may have a T-phase of a tetragonal crystal structure in the same way as the general characteristics of the anti-ferroelectric material. Accordingly, a first polarization direction P1 of the first dielectric layer 171 may be aligned in a thickness direction (e.g., the Z direction of FIG. 1) of the dielectric layer structure 170. In addition, each of the plurality of first dielectric layers 171 may have a first thickness in the thickness direction of the dielectric layer structure 170, and the first thickness may be equal to or greater than about 5 Å. In an implementation, the first thickness may be about 5 Å to about 20 Å.

In some embodiments, each of the plurality of second dielectric layers 172 may include a ferroelectric material. As the first dielectric layers 171 are lowermost and uppermost in the stacked structure constituting the dielectric layer structure 170, the second dielectric layer 172 may not directly face or be in direct contact with the first electrode 160 and the second electrode 180.

In the integrated circuit device 100 of the example embodiments, the second dielectric layer 172 may be a ferroelectric material containing a metal A, a metal B, and oxygen. In an implementation, the second dielectric layer 172 may include $A_xB_{1-x}O_2$ (where $0<x<y$, y is the maximum value capable of maintaining ferroelectric characteristics and determined according to the types of the metal A and the metal B), and may be configured to gradually change the x value in the thickness direction of the dielectric layer structure 170 inside the second dielectric layer 172.

In an implementation, in the integrated circuit device 100 of the example embodiments, the metal A may be zirconium (Zr), and the metal B may be hafnium (Hf), in this case, y=0.5. In an implementation, the second dielectric layer 172 may include $Hf_{1-x}Zr_xO_2$ (where, $0<x<0.5$), and may be configured to gradually change the x value in the thickness direction of the dielectric layer structure 170 inside the second dielectric layer 172. In an implementation, the second dielectric layer 172 may be configured as a binary metal oxide layer.

In some embodiments, the second dielectric layer 172 may include a first surface proximate to the first electrode 160 and a second surface proximate to the second electrode 180, and the x value may be configured to be smallest in the first surface and largest in the second surface inside the second dielectric layer 172. In an implementation, inside the second dielectric layer 172, a first sub-dielectric layer 172A1 may include $Hf_{0.9}Zr_{0.1}O_2$, a second sub-dielectric layer 172A2 on the first sub-dielectric layer 172A1 may include $Hf_{0.8}Zr_{0.2}O_2$, a third sub-dielectric layer 172A3 on the second sub-dielectric layer 172A2 may include $Hf_{0.7}Zr_{0.3}O_2$, and a fourth sub-dielectric layer 172A4 on the third sub-dielectric layer 172A3 may include $Hf_{0.6}Zr_{0.4}O_2$, and the first to fourth sub-dielectric layers 172A1, 172A2, 172A3, and 172A4 may be sequentially stacked.

In the integrated circuit device 100 of the example embodiments, the second dielectric layer 172 may have polarization characteristics between an O-phase having an orthorhombic crystal structure and a T-phase having a tetragonal crystal structure. Accordingly, inside the second dielectric layer 172, a second polarization direction P2 may be in a shape rotating at a certain angle in the thickness direction of the dielectric layer structure 170. In an implementation, inside the second dielectric layer 172, the second polarization direction P2 may gradually change according to the change in the x value. In addition, each of the plurality of second dielectric layers 172 may have a second thickness in the thickness direction of the dielectric layer structure 170, and the second thickness may be equal to or greater than about 5 Å. In an implementation, the second thickness may be about 5 Å to about 20 Å.

As described above, in the dielectric layer structure 170, a plurality of ferroelectric materials having the second polarization direction P2 rotated in advance may be between the plurality of anti-ferroelectric materials, and thus, it is easy to adjust the polarization inside the plurality of ferroelectric materials, and a relatively easier rotation may be possible. In addition, the dielectric layer structure 170 may have a third thickness to have such characteristics, and the third thickness may be equal to or less than about 60 Å. In an implementation, the third thickness may be about 15 Å to about 60 Å.

Although not bound by a particular theory, inside the second dielectric layer 172 in which the second polarization direction P2 may be adjusted in advance, the remnant polarization characteristic of the ferroelectric material may be locally suppressed to facilitate a polarization alignment, and thus, the capacitor structure CS may have a relatively large capacitance.

Ultimately, the integrated circuit device 100 according to the example embodiments may efficiently implement the capacitor structure CS capable of securing desired capacitance, using the characteristic of a material that may gradually change the polarization direction in a stack direction inside the ferroelectric material layer.

Figure 4:
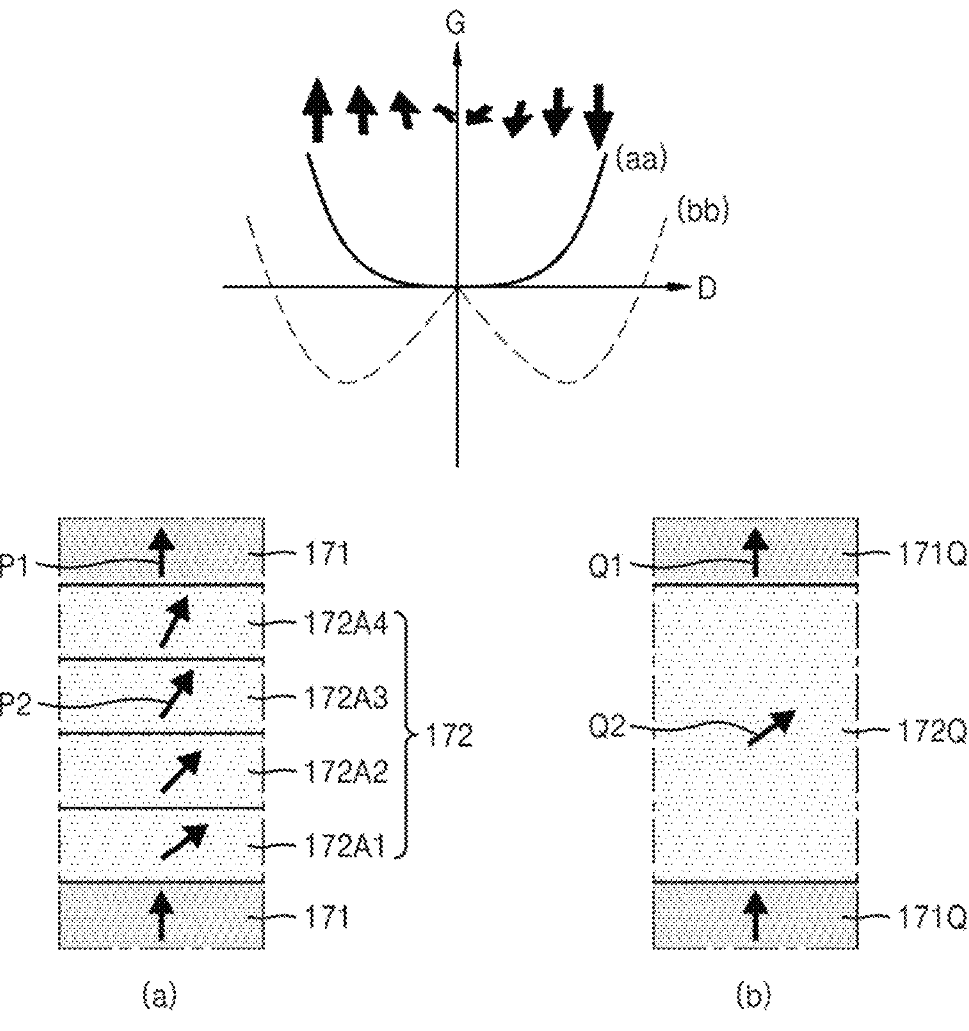
FIG. 4 is a graph illustrating a free energy-polarization curve according to an example embodiment.

FIG. 4 is a graph illustrating a free energy-polarization curve according to an example embodiment.

FIG. 4 shows a change G of free energy according to a change D of polarization in the Experimental Example a of the example embodiments and the General Comparative Example b. Here, both the Experimental Example a of the example embodiments and the General Comparative Example b included a structure in which a plurality of first dielectric layers 171 and 171Q and a plurality of second dielectric layers 172 and 172Q are alternately stacked.

In the Experimental Example a, the second dielectric layer 172 included $Hf_{1-x}Zr_xO_2$ (where, $0<x<0.5$), and may be configured to gradually change the x value in the thickness direction inside the second dielectric layer 172. The first polarization direction P1 of the first dielectric layer 171 may be aligned in one direction in the thickness direction, and the second polarization direction P2 of the second dielectric layer 172 may be in a shape rotating with a certain angle in the thickness direction.

On the contrary, in the General Comparative Example b, the second dielectric layer 172Q includes $HfO_2$. The first polarization direction Q1 of the first dielectric layer 171Q may be aligned in one direction in the thickness direction, and the second polarization direction Q2 of the second dielectric layer 172Q may be aligned in one direction in the thickness direction As shown in the graph of FIG. 4, it may be seen that the free energy-polarization curve aa according to the Experimental Example a is different from the free energy-polarization curve bb according to the General Comparative Example b.

It may be confirmed that the free energy-polarization curve aa using the Experimental Example a has a minimum value of free energy at a point where the polarization is zero, and the minimum value tends to be greater than or equal to zero. Although not bound by a particular theory, each of the second dielectric layers 172 in the Experimental Example a may be a ferroelectric material, but may be regarded as partially exhibiting the polarization characteristics of the paraelectric material.

Figure 5:
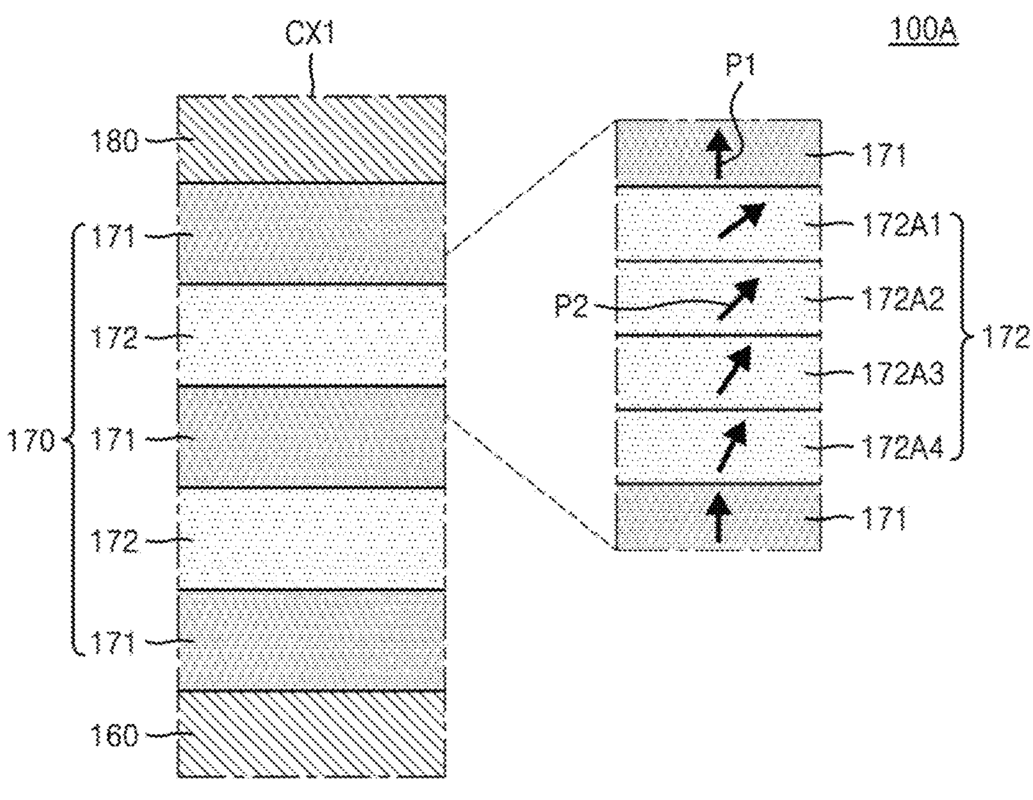
FIGS. 5 and 6 are cross-sectional views illustrating integrated circuit devices according to an example embodiment.
Figure 6:
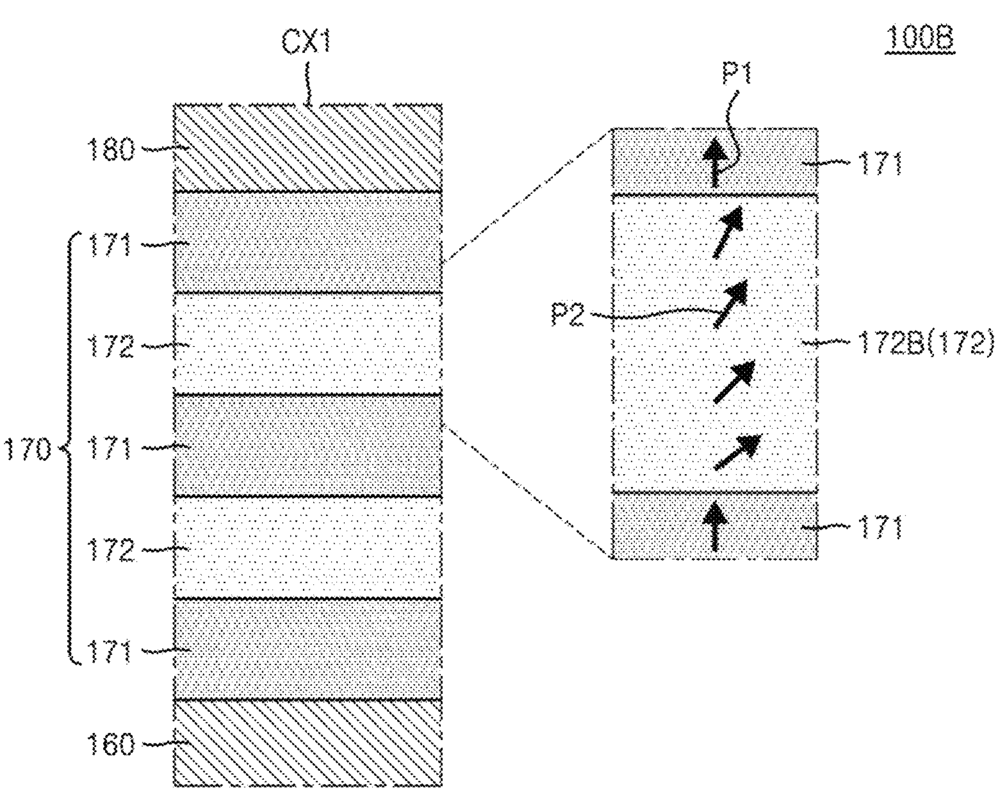

FIGS. 5 and 6 are cross-sectional views illustrating integrated circuit devices according to an example embodiment.

Most components constituting integrated circuit devices 100A and 100B described below and materials constituting the components are substantially the same as or similar to those described above with reference to FIGS. 1 to 3. Therefore, for convenience of description, differences of the integrated circuit devices 100A and 100B from the integrated circuit device 100 described above are mainly described.

Referring to FIGS. 1 and 5 together, the integrated circuit device 100A may include the lower insulating layer 130 on the substrate 110, the contact 150 on the substrate 110 and covered by the lower insulating layer 130, and the capacitor structure CS on the contact 150.

In the integrated circuit device 100A of the embodiment, the second dielectric layer 172 may include $Hf_{1-x}Zr_xO_2$ (where, $0<x<0.5$), and may be configured to gradually change the x value in the thickness direction of the dielectric layer structure 170 inside the second dielectric layer 172.

In an implementation, the second dielectric layer 172 may include a first surface proximate to the first electrode 160 and a second surface proximate to the second electrode 180, and the x value may be configured to be largest in the first surface and smallest in the second surface inside the second dielectric layer 172.

In an implementation, inside the second dielectric layer 172, the first sub-dielectric layer 172A1 may include $Hf_{0.9}Zr_{0.1}O_2$, the second sub-dielectric layer 172A2 on the first sub-dielectric layer 172A1 may include $Hf_{0.8}Zr_{0.2}O_2$, the third sub-dielectric layer 172A3 on the second sub-dielectric layer 172A2 may include $Hf_{0.7}Zr_{0.3}O_2$, and the fourth sub-dielectric layer 172A4 on the third sub-dielectric layer 172A3 may include $Hf_{0.6}Zr_{0.4}O_2$, and the first to fourth sub-dielectric layers 172A1, 172A2, 172A3, and 172A4 may be stacked in reverse order.

Referring to FIGS. 1 and 6 together, an integrated circuit device 100B may include the lower insulating layer 130 on the substrate 110, the contact 150 on the substrate 110 and covered by the lower insulating layer 130, and the capacitor structure CS on the contact 150.

In the integrated circuit device 100B of this embodiment, the second dielectric layer 172 may include $Hf_{1-x}Zr_xO_2$ (where, $0<x<0.5$), and may be configured to gradually change the x value in the thickness direction of the dielectric layer structure 170 inside the second dielectric layer 172.

In an implementation, the second dielectric layer 172 may include a first surface proximate to the first electrode 160 and a second surface proximate to the second electrode 180, and the x value may be configured to be smallest in the first surface and largest in the second surface inside the second dielectric layer 172.

In an implementation, zirconium (Zr) may be contained so that the x value continuously changes inside the second dielectric layer 172. In an implementation, the second dielectric layer 172 may be configured as a single sub-dielectric layer 172B according to a concentration gradient without an interface present therein.

Figure 7:
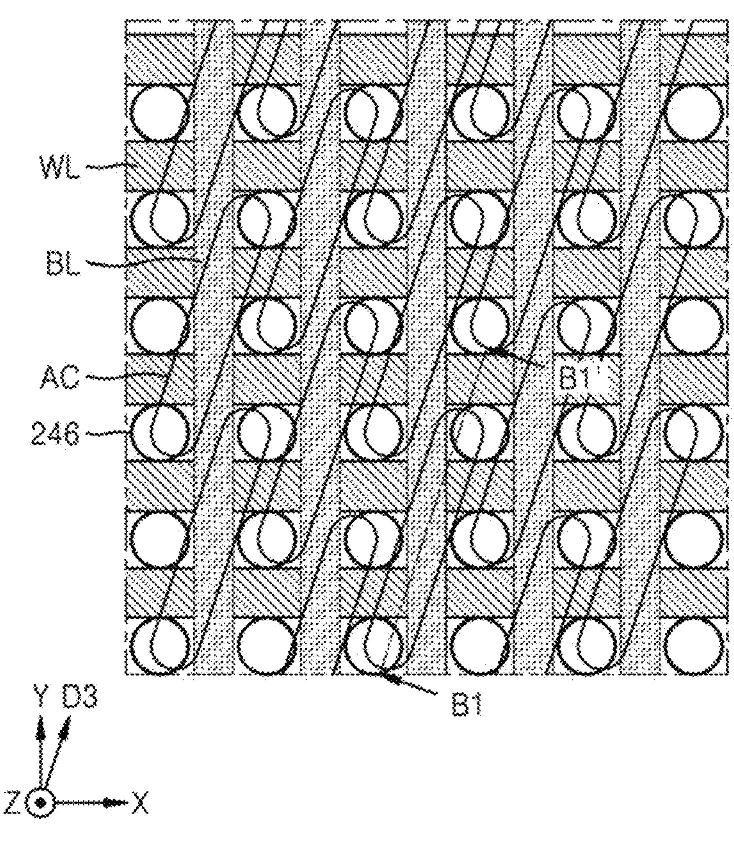
FIG. 7 is a layout illustrating an integrated circuit device according to an example embodiment.
Figure 8:
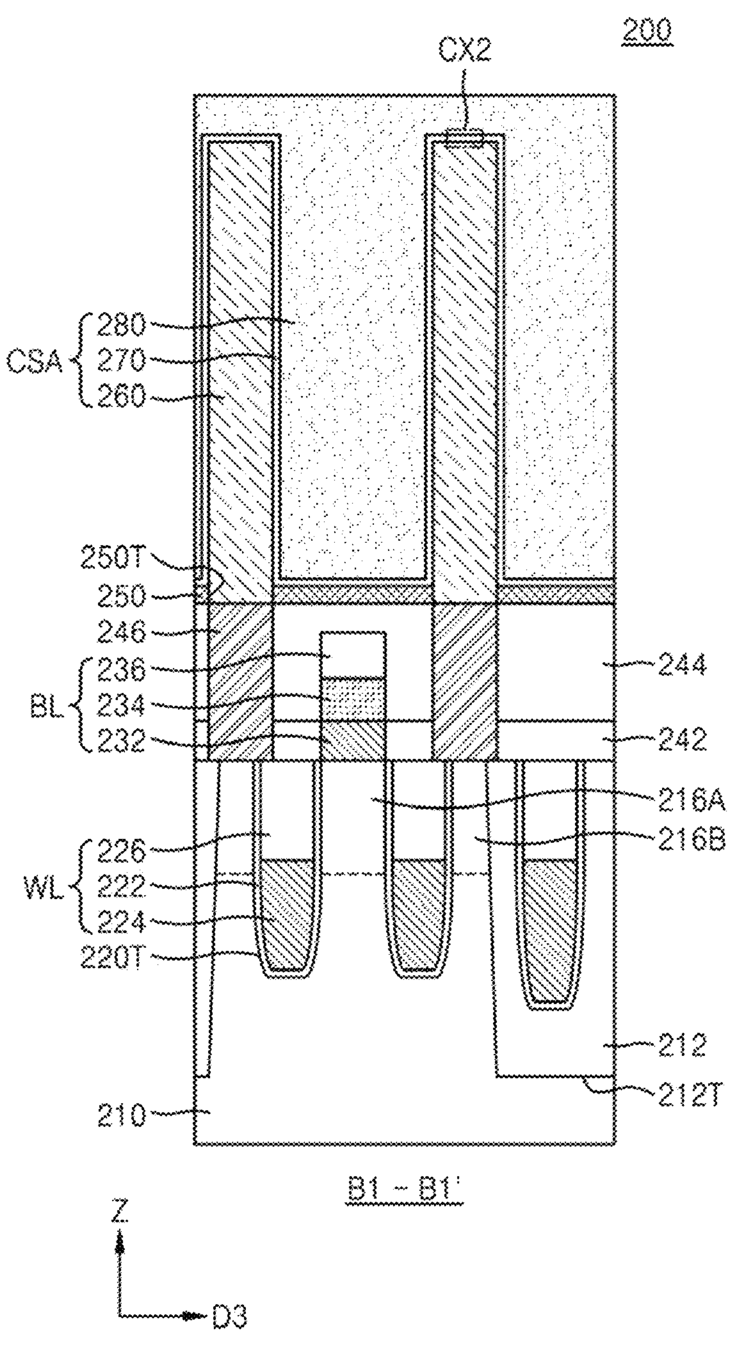
FIG. 8 is a cross-sectional view taken along line B1-B1' of FIG. 7.
Figure 9:
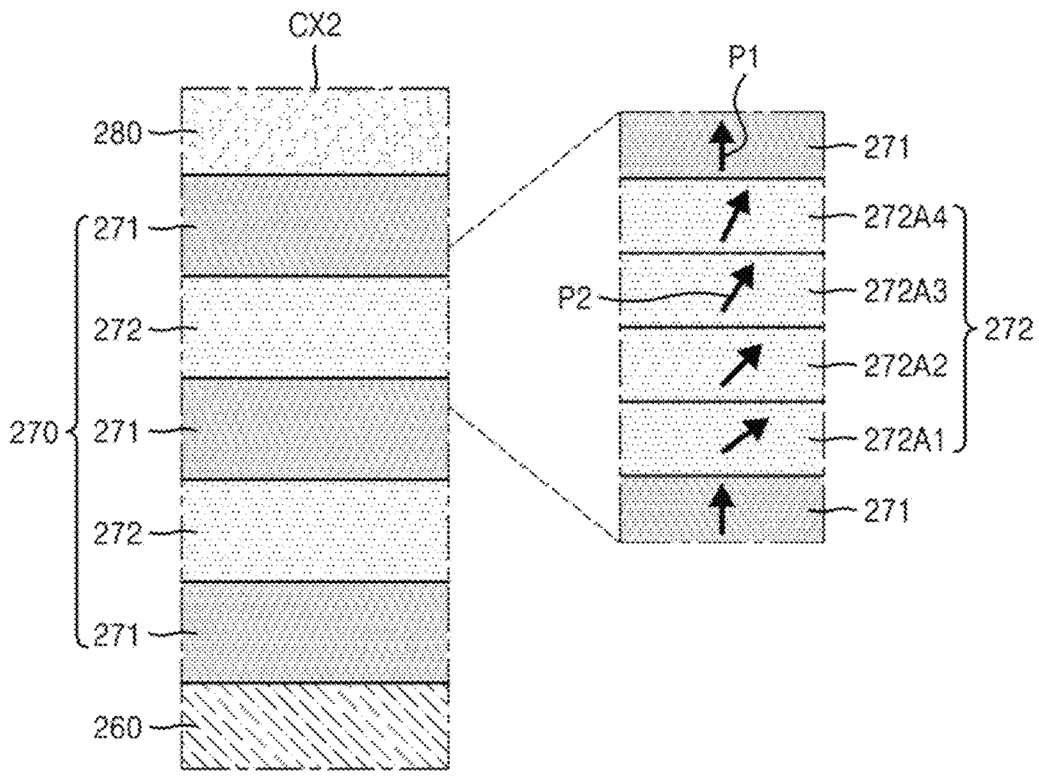
FIG. 9 is an enlarged view of a portion CX2 of FIG. 8.

FIG. 7 is a layout illustrating an integrated circuit device according to an example embodiment, FIG. 8 is a cross-sectional view taken along line B1-B1' of FIG. 7, and FIG. 9 is an enlarged view of a portion CX2 of FIG. 8.

Referring to FIGS. 7 to 9 together, an integrated circuit device 200 may include a capacitor structure CSA on a buried channel array transistor (BCAT) structure.

A substrate 210 may include active regions AC defined by a device isolation layer 212. In some embodiments, the substrate 210 may be a silicon (Si) wafer.

In some embodiments, the device isolation layer 212 may have a shallow trench isolation (STI) structure. In an implementation, the device isolation layer 212 may include an insulating material filling the device isolation trench 212T formed in the substrate 210. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or Tonen SilaZene (TOSZ).

Each of the active regions AC may have a relatively long island shape having a minor axis and a major axis, respectively. As illustrated, the major axis of the active region AC may be arranged in a direction D3 parallel to an upper surface of the substrate 210. In some embodiments, the active region AC may have a first conductivity type. The first conductivity type may be p-type (or n-type).

The substrate 210 may include word line trenches 220T extending in an X direction. The word line trench 220T may intersect with the active region AC and may be formed to a certain depth from the upper surface of the substrate 210. A part of the word line trench 220T may extend into the device isolation layer 212, and a part of the word line trench 220T formed in the device isolation layer 212 may include a bottom surface located at a lower level than a part of the word line trench 220T formed in the active region AC.

A first source/drain region 216A and a second source/drain region 216B may be in an upper portion of the active region AC positioned on both sides of the word line trench 220T. The first source/drain regions 216A and the second source/drain regions 216B may be impurity regions doped with impurities having a second conductivity type that is different from the first conductivity type. The second conductivity type may be n-type (or p-type).

A word line WL may be formed in the word line trench 220T. The word line WL may include a gate insulating layer 222, a gate electrode 224, and a gate capping layer 226 sequentially on an inner wall of the word line trench 220T.

The gate insulating layer 222 may be conformally on the inner wall of the word line trench 220T to a certain thickness. The gate insulating layer 222 may include, e.g., silicon oxide, silicon nitride, silicon oxynitride, oxide/nitride/oxide (ONO), or a high-k material having a dielectric constant that is higher than that of silicon oxide. In an implementation, the gate insulating layer 222 may have a dielectric constant of about 10 to about 25. In some embodiments, the gate insulating layer 222 may include $HfO_2$, $Al_2O_3$, $HfAlO_3$, $Ta_2O_3$, $TiO_2$, or a combination thereof.

The gate electrode 224 may be on the gate insulating layer 222 to fill the word line trench 220T from the bottom portion of the word line trench 220T to a certain height. In an implementation, the gate electrode 224 may include a work function adjusting layer on the gate insulating layer 222 and a buried metal layer filling the bottom portion of the word line trench 220T on the work function adjusting layer. In an implementation, the work function adjusting layer may include a metal, a metal nitride, or a metal carbide, such as Ti, TiN, TiAlN, TiAlC, TiAlCN, TiSiCN, Ta, TaN, TaAlN, TaAlCN, TaSiCN, etc., and the buried metal layer may include, e.g., W, WN, TiN, or TaN.

The gate capping layer 226 on the gate electrode 224 may fill the remaining part of the word line trench 220T. In an implementation, the gate capping layer 226 may include, e.g., silicon oxide, silicon oxynitride, or silicon nitride.

A bit line BL extending in a Y direction perpendicular to the X direction may be on the first source/drain region 216A. The bit line BL may include a bit line contact 232, a bit line conductive layer 234, and a bit line capping layer 236 sequentially stacked on the substrate 210. In an implementation, the bit line contact 232 may include polysilicon, and the bit line conductive layer 234 may include a metal material. The bit line capping layer 236 may include an insulating material, such as silicon nitride or silicon oxynitride. Although it is shown that a bottom surface of the bit line contact 232 has the same level as the upper surface of the substrate 210, the bottom surface of the bit line contact 232 may be formed at a lower level than the upper surface of the substrate 210.

In an implementation, a bit line intermediate layer may be between the bit line contact 232 and the bit line conductive layer 234. The bit line intermediate layer may include a metal silicide, such as tungsten silicide, or a metal nitride, such as tungsten nitride. A bit line spacer may be further on a sidewall of the bit line BL. The bit line spacer may include a single-layer or multi-layer structure including an insulating material, such as silicon oxide, silicon oxynitride, or silicon nitride. In addition, the bit line spacer may further include an air space.

A first interlayer insulating layer 242 may be on the substrate 210, and the bit line contact 232 may pass through the first interlayer insulating layer 242 to be connected to the first source/drain region 216A. A bit line conductive layer 234 and a bit line capping layer 236 may be on the bit line contact 232. A second interlayer insulating layer 244 may be on the first interlayer insulating layer 242 to cover side surfaces and upper surfaces of the bit line conductive layer 234 and the bit line capping layer 236.

The contact structure 246 may be on the second source/drain region 216B. The first and second interlayer insulating layers 242 and 244 may surround the sidewall of the contact structure 246. In some embodiments, the contact structure 246 may include a lower contact pattern, a metal silicide layer, and an upper contact pattern sequentially stacked on the substrate 210, and a barrier layer surrounding a side surface and a bottom surface of the contact pattern. In some embodiments, the lower contact pattern may include polysilicon, and the upper contact pattern may include a metal material. The barrier layer may include a metal nitride having conductivity.

The capacitor structure CSA may be on the second interlayer insulating layer 244. The capacitor structure CSA may include a lower electrode 260 electrically connected to the contact structure 246, a dielectric layer structure 270 on the lower electrode 260, and an upper electrode 280 on the dielectric layer structure 270. Meanwhile, an etch stop layer 250 including an opening 250T may be on the second interlayer insulating layer 244, and a bottom portion of the lower electrode 260 may be in the opening 250T of the etch stop layer 250.

It is shown that the capacitor structures CSA are repeatedly arranged in the X and Y directions on the contact structures 246 that are repeatedly arranged in the X and Y directions. In an implementation, the capacitor structures CSA may be arranged in a hexagonal shape, such as a honeycomb structure on the contact structures 246 repeatedly arranged in the X and Y directions, in this case, a landing pad may be formed between the contact structures 246 and the capacitor structure CSA.

The lower electrode 260 may be formed in a pillar shape extending in the Z direction on the contact structure 246, and the dielectric layer structure 270 may be conformally on the upper surface and the sidewall of the lower electrode 260. The dielectric layer structure 270 may include a structure in which a plurality of first dielectric layers 271 and a plurality of second dielectric layers 272 are alternately stacked. An upper electrode 280 may be on the dielectric layer structure 270.

The lower electrode 260, the dielectric layer structure 270, and the upper electrode 280 may be substantially the same as the first electrode 160, the dielectric layer structure 170, and the second electrode 180 respectively described with reference to FIGS. 1 to 3. Also, the first dielectric layer 271 and the second dielectric layer 272 may be substantially the same as the first dielectric layer 171 and the second dielectric layer 172 respectively described with reference to FIGS. 1 to 3. The first sub-dielectric layer 272A1, the second sub-dielectric layer 272A2, the third sub-dielectric layer 272A3, and the fourth sub-dielectric layer 272A4 may be substantially the same as the first sub-dielectric layer 172A1, the second sub-dielectric layer 172A2, the third sub-dielectric layer 172A3, and the fourth sub-dielectric layer 172A4 respectively described with reference to FIGS. 1 to 3. Therefore, detailed descriptions thereof may be omitted.

Ultimately, the integrated circuit device 200 according to the example embodiments may efficiently implement the capacitor structure CSA capable of securing desired capacitance, using the characteristic of a material that may gradually change the polarization direction in a stack direction inside the ferroelectric material layer.

Figure 10:
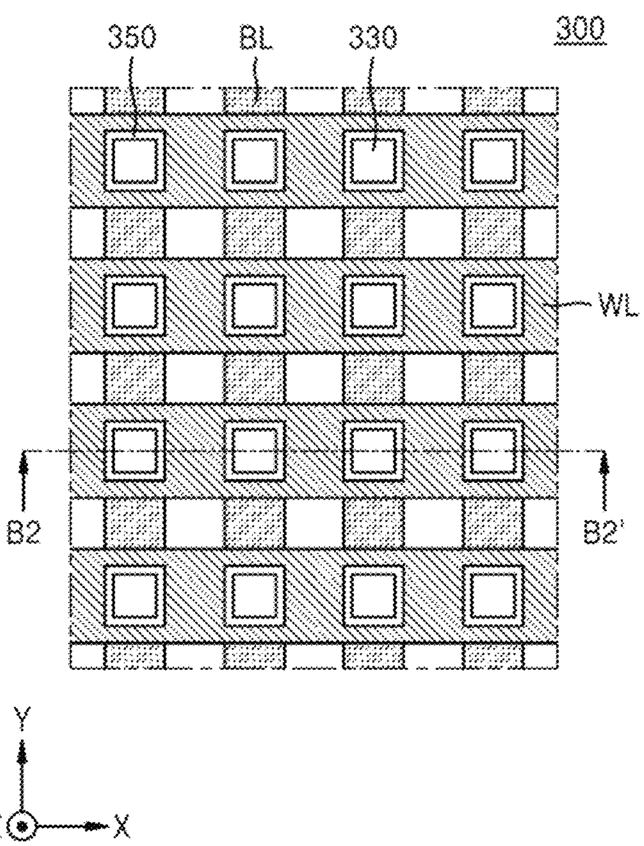
FIG. 10 is a layout illustrating an integrated circuit device according to an example embodiment.
Figure 11:
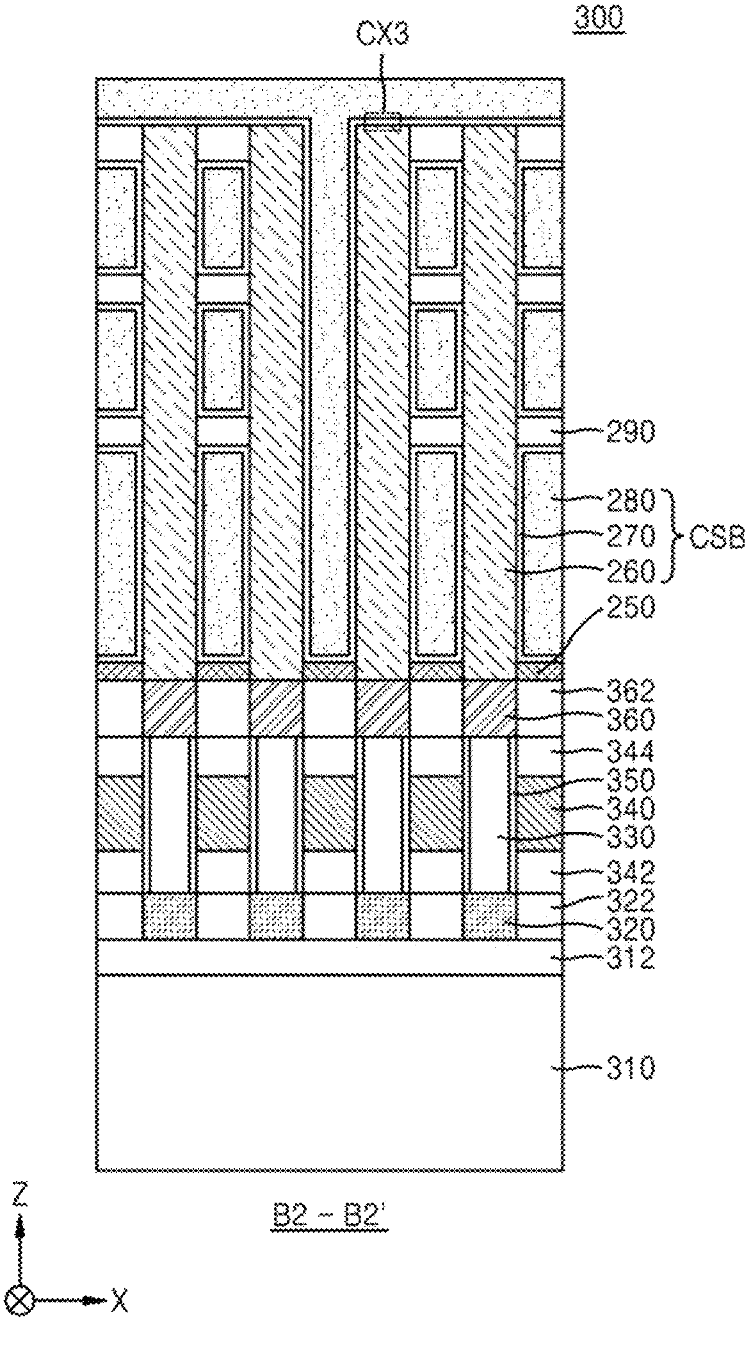
FIG. 11 is a cross-sectional view taken along line B2-B2' of FIG. 10.
Figure 12:
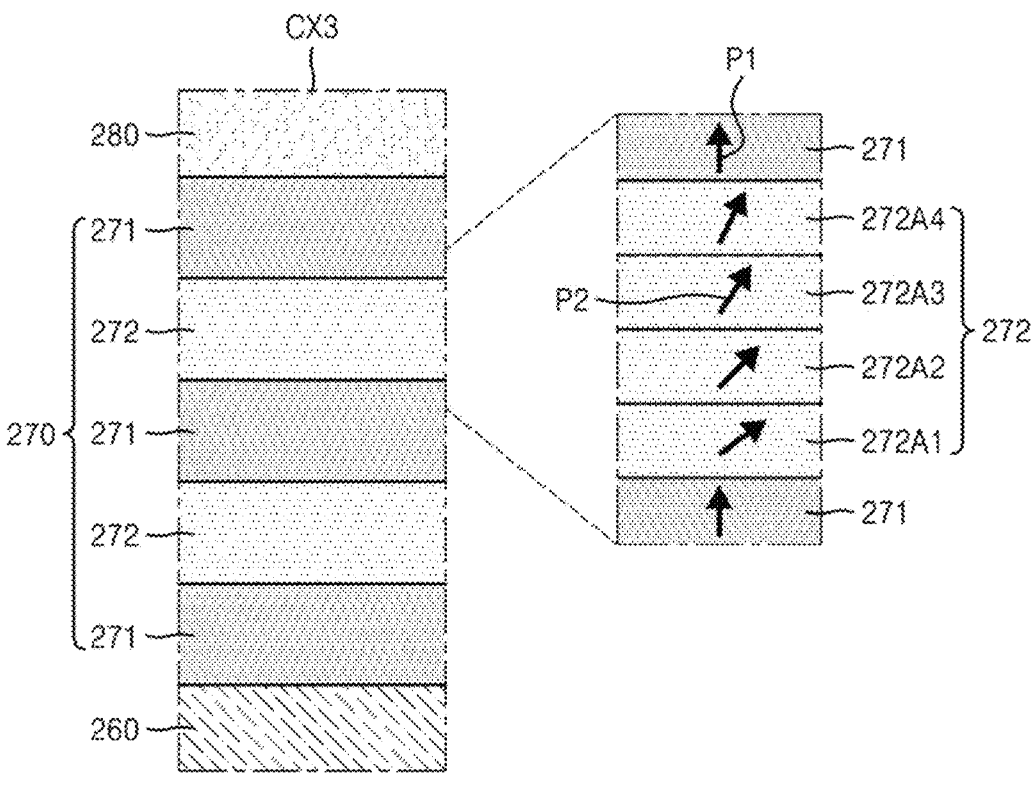
FIG. 12 is an enlarged view of a portion CX3 of FIG. 11.

FIG. 10 is a layout illustrating an integrated circuit device according to an example embodiment, FIG. 11 is a cross-sectional view taken along line B2-B2' of FIG. 10, and FIG. 12 is an enlarged view of a portion CX3 of FIG. 11.

Referring to FIGS. 10 to 12, an integrated circuit device 300 may include a capacitor structure CSB on a vertical channel transistor (VCT) structure.

A lower insulating layer 312 may be on a substrate 310, and a plurality of first conductive lines 320 may be spaced apart from each other in the X direction and extend in the Y direction on the lower insulating layer 312. A plurality of first insulating patterns 322 may be on the lower insulating layer 312 to fill spaces between the plurality of first conductive lines 320. The plurality of first conductive lines 320 may respectively correspond to the bit lines BL of the integrated circuit device 300.

In some embodiments, the plurality of first conductive lines 320 may include doped polysilicon, metal, conductive metal nitride, conductive metal silicide, conductive metal oxide, or a combination thereof. In an implementation, the plurality of first conductive lines 320 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, or a combination thereof. The plurality of first conductive lines 320 may include a single-layer or multi-layer structure of the above materials. In some embodiments, the plurality of first conductive lines 320 may include a two-dimensional (2D) semiconductor material, e.g., the 2D semiconductor material may include graphene, carbon nanotube, or a combination thereof.

Channel layers 330 may be arranged in an island shape spaced apart from each other in the X and Y directions on the plurality of first conductive lines 320. The channel layer 330 may have a channel width in the X direction and a channel height in the Z direction, and the channel height may be greater than the channel width. A bottom portion of the channel layer 330 may function as a first source/drain region, and an upper portion of the channel layer 330 may function as a second source/drain region, and a part of the channel layer 330 between the first and second source/drain regions may function as a channel region. The VCT may refer to a structure in which the channel length of the channel layer 330 extends from the substrate 310 in the Z direction.

In some embodiments, the channel layer 330 may include an oxide semiconductor, e.g., the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or combinations thereof. The channel layer 330 may include a single-layer or multi-layer structure of the oxide semiconductor. In some embodiments, the channel layer 330 may have a bandgap energy greater than that of silicon. The channel layer 330 may be polycrystalline or amorphous. In some embodiments, the channel layer 330 may include a 2D semiconductor material, e.g., the 2D semiconductor material may include graphene, carbon nanotubes, or a combination thereof.

In some embodiments, the gate electrode 340 may surround the sidewall of the channel layer 330 and may extend in the X direction. In the drawing, the gate electrode 340 may be a gate-all-around type gate electrode surrounding the entire sidewall of the channel layer 330. The gate electrode 340 may correspond to the word line WL of the integrated circuit device 300.

In some embodiments, the gate electrode 340 may be a dual gate-type gate electrode, and may include, e.g., a first sub-gate electrode facing a first sidewall of the channel layer 330 and a second sub-gate electrode facing a second sidewall opposite to the first sidewall of the channel layer 330.

In some embodiments, the gate electrode 340 may be a single gate-type gate electrode that covers only the first sidewall of the channel layer 330 and extends in the X direction.

The gate electrode 340 may include doped polysilicon, metal, conductive metal nitride, conductive metal silicide, conductive metal oxide, or a combination thereof. In an implementation, the gate electrode 340 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

The gate insulating layer 350 may surround the sidewall of the channel layer 330, and may be between the channel layer 330 and the gate electrode 340. In some embodiments, the gate insulating layer 350 may include a silicon oxide film, a silicon oxynitride film, a high-k film having a higher dielectric constant than that of the silicon oxide film, or a combination thereof. The high-k film may include a metal oxide or a metal oxynitride. In an implementation, the high-k film constituting the gate insulating layer 350 may include $HfO_2$, HfSiO, HfSiON, HfTaO, HfTiO, HfZrO, $ZrO_2$, $Al_2O_3$, or a combination thereof.

A first buried insulating layer 342 surrounding a lower sidewall of the channel layer 330 may be on the plurality of first insulating patterns 322, and a second buried insulating layer 344 surrounding an upper sidewall of the channel layer 330 and covering the gate electrode 340 may be on the first buried insulating layer 342.

A capacitor contact 360 may be on the channel layer 330. The capacitor contacts 360 may be arranged to vertically overlap the channel layer 330 and may be arranged in a matrix form spaced apart from each other in the X and Y directions. The capacitor contact 360 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, or a combination thereof. The upper insulating layer 362 may surround a sidewall of the capacitor contact 360 on the second buried insulating layer 344.

An etch stop layer 250 may be on the upper insulating layer 362, and the capacitor structure CSB may be on the etch stop layer 250. The capacitor structure CSB may include the lower electrode 260, the dielectric layer structure 270, and the upper electrode 280. The lower electrode 260 may be electrically connected to the capacitor contact 360, the dielectric layer structure 270 may cover the lower electrode 260, and the upper electrode 280 may cover the dielectric layer structure 270. A support member 290 may be on the sidewall of the lower electrode 260.

The lower electrode 260, the dielectric layer structure 270, and the upper electrode 280 may be substantially the same as the first electrode 160, the dielectric layer structure 170, and the second electrode 180 respectively described with reference to FIGS. 1 to 3. Also, the first dielectric layer 271 and the second dielectric layer 272 may be substantially the same as the first dielectric layer 171 and the second dielectric layer 172 respectively described with reference to FIGS. 1 to 3. The first sub-dielectric layer 272A1, the second sub-dielectric layer 272A2, the third sub-dielectric layer 272A3, and the fourth sub-dielectric layer 272A4 may be substantially the same as the first sub-dielectric layer 172A1, the second sub-dielectric layer 172A2, the third sub-dielectric layer 172A3, and the fourth sub-dielectric layer 172A4 respectively described with reference to FIGS. 1 to 3. Therefore, detailed descriptions thereof are omitted.

Ultimately, the integrated circuit device 300 according to the example embodiments may efficiently implement the capacitor structure CSB capable of securing desired capacitance, using the characteristic of a material that may gradually change the polarization direction in a stack direction inside the ferroelectric material layer.

Figure 13:
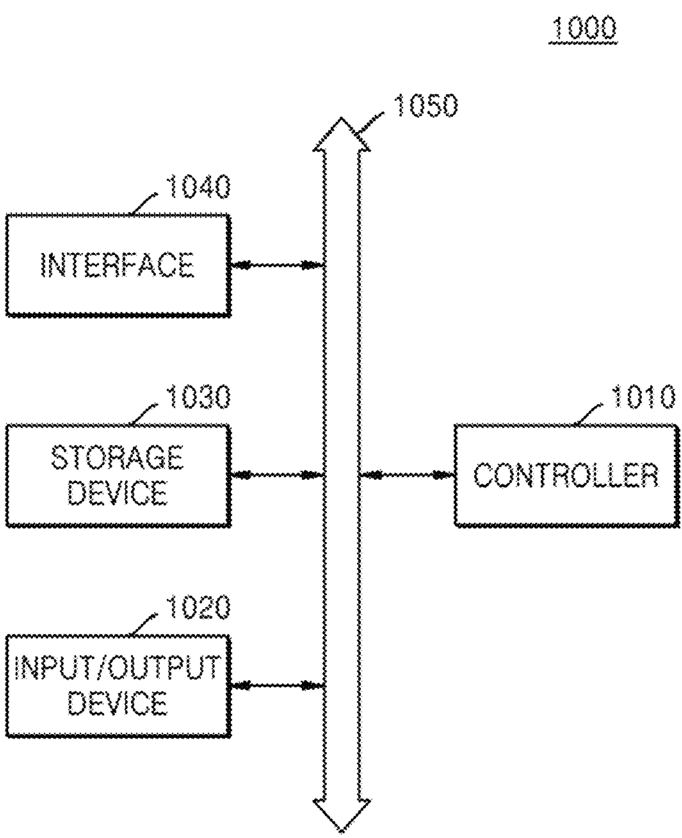
FIG. 13 is a block diagram illustrating a system including an integrated circuit device according to an example embodiment.

FIG. 13 is a block diagram illustrating a system including an integrated circuit device according to an example embodiment.

Referring to FIG. 13, a system 1000 includes a controller 1010, an input/output device 1020, a storage device 1030, an interface 1040, and a bus 1050.

The system 1000 may be a mobile system or a system transmitting or receiving information. In some embodiments, the mobile system may be a portable computer, a web tablet, a mobile phone, a digital music player, or a memory card.

The controller 1010 may be for controlling an executable program in the system 1000, and may include a microprocessor, a digital signal processor, a microcontroller, or a similar device.

The input/output device 1020 may be used to input or output data of the system 1000. The system 1000 may be connected to an external device, e.g., a personal computer or a network, by using the input/output device 1020, and may exchange data with the external device. The input/output device 1020 may be, e.g., a touch screen, a touch pad, a keyboard, or a display.

The storage device 1030 may store data for the operation of the controller 1010 or data processed by the controller 1010. The storage device 1030 may include any one of the integrated circuit devices 100, 100A, 100B, 200, and 300 according to the example embodiments described above.

The interface 1040 may be a data transmission path between the system 1000 and an external device. The controller 1010, the input/output device 1020, the storage device 1030, and the interface 1040 may communicate with each other via the bus 1050.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the example embodiments as set forth in the following claims.

What is claimed is:

1. An integrated circuit device comprising:

a transistor on a substrate; and a capacitor structure electrically connected to the transistor, wherein the capacitor structure includes:

a first electrode;

a dielectric layer structure on the first electrode; and a second electrode on the dielectric layer structure, wherein the dielectric layer structure includes a plurality of first dielectric layers and a plurality of second dielectric layers which are alternately stacked, wherein each of the plurality of first dielectric layers includes an anti-ferroelectric material, and wherein each of the plurality of second dielectric layers includes $Hf_{1-x}Zr_xO_2$ in which $0<x<0.5$, as a ferroelectric material, wherein an x value gradually changes in a stack direction inside each of the plurality of second dielectric layers.

2. The integrated circuit device as claimed in claim 1, wherein:

each of the plurality of first dielectric layers has a first polarization direction according to a T-phase of a tetragonal crystal structure, and each of the plurality of second dielectric layers has a second polarization direction between an O-phase of an orthorhombic crystal structure and the T-phase of the tetragonal crystal structure.

3. The integrated circuit device as claimed in claim 2, wherein the second polarization direction gradually changes according to the change in the x value, inside each of the plurality of second dielectric layers.

4. The integrated circuit device as claimed in claim 1, wherein:

each of the plurality of second dielectric layers includes a first surface proximate to the first electrode and a second surface proximate to the second electrode, and the x value is largest on the first surface and smallest on the second surface, inside each of the plurality of second dielectric layers.

5. The integrated circuit device as claimed in claim 1, wherein:

each of the plurality of second dielectric layers includes a first surface proximate to the first electrode and a second surface proximate to the second electrode, and the x value is smallest on the first surface and largest on the second surface, inside each of the plurality of second dielectric layers.

6. The integrated circuit device as claimed in claim 1, wherein:

each of the plurality of first dielectric layers includes a single metal oxide layer, and each of the plurality of second dielectric layers includes a binary metal oxide layer.

7. The integrated circuit device as claimed in claim 6, wherein:

each of the plurality of first dielectric layers includes $ZrO_2$, and $Hf_{0.9}Zr_{0.1}O_2$, $Hf_{0.8}Zr_{0.2}O_2$, $Hf_{0.7}Zr_{0.3}O_2$, and $Hf_{0.6}Zr_{0.4}O_2$ are sequentially inside each of the plurality of second dielectric layers.

8. The integrated circuit device as claimed in claim 1, wherein:

each of the plurality of first dielectric layers has a first thickness in a vertical direction to an upper surface of the first electrode, the first thickness being about 5 Å to about 20 Å, each of the plurality of second dielectric layers has a second thickness in the vertical direction, the second thickness being about 5 Å to about 20 Å, and the dielectric layer structure has a third thickness in the vertical direction, the third thickness being about 15 Å to about 60 Å.

9. The integrated circuit device as claimed in claim 8, wherein a free energy-polarization curve of the dielectric layer structure has a minimum value of free energy at a point where a polarization is zero, the minimum value being greater than or equal to zero.

10. The integrated circuit device as claimed in claim 1, wherein:

a lowermost layer and an uppermost layer of the dielectric layer structure are both included in the plurality of first dielectric layers, the lowermost layer is in direct contact with the first electrode, and the uppermost layer is in direct contact with the second electrode.

11. An integrated circuit device comprising:

a transistor on a substrate; and a capacitor structure electrically connected to the transistor, wherein the capacitor structure includes:

a first electrode;

a dielectric layer structure on the first electrode; and a second electrode on the dielectric layer structure, wherein the dielectric layer structure includes a plurality of first dielectric layers and a plurality of second dielectric layers which are alternately stacked, wherein each of the plurality of first dielectric layers includes an anti-ferroelectric material containing a metal A and oxygen, and wherein each of the plurality of second dielectric layers includes a ferroelectric material containing the metal A, a metal B, and oxygen, and includes $A_xB_{1-x}O_2$ in which $0<x<0.5$, wherein an x value gradually changes in a stack direction inside each of the plurality of second dielectric layers.

12. The integrated circuit device as claimed in claim 11, wherein:

the metal A includes zirconium (Zr) in each of the plurality of first dielectric layers and each of the plurality of second dielectric layers, and the metal B includes hafnium (Hf) in each of the plurality of second dielectric layers.

13. The integrated circuit device as claimed in claim 12, wherein:

each of the plurality of first dielectric layers includes $ZrO_2$, and $Hf_{0.9}Zr_{0.1}O_2$, $Hf_{0.8}Zr_{0.2}O_2$, $Hf_{0.7}Zr_{0.3}O_2$, and $Hf_{0.6}Zr_{0.4}O_2$ are sequentially arranged, inside each of the plurality of second dielectric layers.

14. The integrated circuit device as claimed in claim 11, wherein:

each of the plurality of second dielectric layers includes a first surface proximate to the first electrode and a second surface proximate to the second electrode, and the x value is largest on the first surface and smallest on the second surface, inside each of the plurality of second dielectric layers.

15. The integrated circuit device as claimed in claim 11, wherein:

each of the plurality of second dielectric layers includes a first surface proximate to the first electrode and a second surface proximate to the second electrode, and the x value is smallest on the first surface and largest on the second surface, inside each of the plurality of second dielectric layers.

16. An integrated circuit device comprising:

a word line in a word line trench extending in a first direction inside a substrate;

a contact structure on one side of the word line on the substrate; and a capacitor structure on the contact structure and electrically connected to the contact structure, wherein the capacitor structure includes:

a first electrode on the contact structure;

a dielectric layer structure covering the first electrode; and a second electrode on the dielectric layer structure, wherein the dielectric layer structure includes a plurality of anti-ferroelectric material layers and a plurality of ferroelectric material layers which are alternately stacked, and wherein each of the plurality of ferroelectric material layers includes $Hf_{1-x}Zr_xO_2$ in which $0<x<0.5$, wherein an x value increases by a unit of 0.1 in a stack direction inside each of the plurality of ferroelectric material layers.

17. The integrated circuit device as claimed in claim 16, wherein:

each of the plurality of anti-ferroelectric material layers has a polarization direction according to a T-phase of a tetragonal crystal structure, and each of the plurality of ferroelectric material layers has a polarization direction between a polarization direction according to an O-phase of an orthorhombic crystal structure and the polarization direction according to the T-phase of the tetragonal crystal structure, and the polarization direction gradually changes according to a change in the x value, inside each of the plurality of ferroelectric material layers.

18. The integrated circuit device as claimed in claim 16, wherein:

each of the plurality of anti-ferroelectric material layers has a first thickness in a vertical direction to an upper surface of the first electrode, the first thickness being about 5 Å to about 20 Å, each of the plurality of ferroelectric material layers has a second thickness in the vertical direction, the second thickness being about 5 Å to about 20 Å, and the dielectric layer structure has a third thickness in the vertical direction, the third thickness being about 15 Å to about 60 Å.

19. The integrated circuit device as claimed in claim 16, wherein each of the plurality of anti-ferroelectric material layers includes at least one of $ZrO_2$, $PbZrO_3$, $PbTiO_3$, and $AgNbO_3$.

20. The integrated circuit device as claimed in claim 16, wherein $Hf_{0.9}Zr_{0.1}O_2$, $Hf_{0.8}Zr_{0.2}O_2$, $Hf_{0.7}Zr_{0.3}O_2$, and $Hf_{0.6}Zr_{0.4}O_2$ are sequentially arranged inside each of the plurality of ferroelectric material layers.

* * * * *